US012787305B2

(12) United States Patent
Chung et al.

(10) Patent No.: US 12,787,305 B2
(45) Date of Patent: Nov. 3, 2026

(54) STACK SEMICONDUCTOR PACKAGE

(71) Applicant: Samsung Electronics Co., Ltd., Suwon-si (KR)

(72) Inventors: Hyunsoo Chung, Suwon-si (KR); Joonghyun Baek, Suwon-si (KR); Hyungu Kang, Suwon-si (KR); Taeyoung Kim, Suwon-si (KR); Jaekyu Sung, Suwon-si (KR); Cheolwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 825 days.

(21) Appl. No.: 18/296,500

(22) Filed: Apr. 6, 2023

(65) Prior Publication Data

US 2024/0063155 A1 Feb. 22, 2024

(30) Foreign Application Priority Data

Aug. 17, 2022 (KR) ........................ 10-2022-0102948

(51) Int. Cl.

*H10B 80/00* (2026.01)
*H10W 72/29* (2026.01)
*H10W 72/90* (2026.01)

(52) U.S. Cl.

CPC ............. *H10B 80/00* (2023.02); *H10W 72/29* (2026.01); *H10W 72/965* (2026.01); *H10W 72/967* (2026.01)

(58) Field of Classification Search

CPC ...................................................... H10B 80/00
See application file for complete search history.

(56) References Cited

U.S. PATENT DOCUMENTS

| | | | | |
|---|---|---|---|---|
| 7,800,138 | B2 | 9/2010 | Baek et al. | |
| 9,177,906 | B1 * | 11/2015 | Jeon ...................... | H10W 20/40 |
| 10,861,808 | B2 | 12/2020 | Chen et al. | |

(Continued)

FOREIGN PATENT DOCUMENTS

| | | | |
|---|---|---|---|
| KR | 10-2009-0023942 | A | 3/2009 |
| KR | 10-2021-0135107 | A | 11/2021 |
| KR | 10-2022-0048695 | A | 4/2022 |

OTHER PUBLICATIONS

Office Action in Korean Appln. No. 10-2022-0102948, mailed on Feb. 2, 2026, 15 pages (with English translation).

*Primary Examiner* — William A Harriston
(74) *Attorney, Agent, or Firm* — Fish & Richardson P.C.

(57) ABSTRACT

A stack semiconductor package including a base chip, at least two semiconductor chips stacked on the base chip, and a sealing material sealing the at least two semiconductor chips on the base chip may be provided. The at least two semiconductor chips may include an uppermost semiconductor chip and at least one under the uppermost semiconductor chip, the first semiconductor chip includes through electrodes at a central portion thereof along a first direction, the through electrodes arranged along a second direction perpendicular to the first direction, upper dummy pads on outer portions of a back side of the first semiconductor chip, the outer portions being a non-active surface of the first semiconductor chip and being at both sides of the central portion in the first direction, and a dummy pattern connecting the upper dummy pads with each other on the back side.

17 Claims, 18 Drawing Sheets

(56) References Cited

U.S. PATENT DOCUMENTS

| | | | | |
|---|---|---|---|---|
| 2007/0246811 | A1* | 10/2007 | Tsai | H10W 90/00 257/E21.705 |
| 2009/0057880 | A1* | 3/2009 | Baek | H10W 20/40 257/713 |
| 2019/0385966 | A1 | 12/2019 | Gao et al. | |
| 2021/0134761 | A1* | 5/2021 | Oh | H10P 54/00 |
| 2021/0343616 | A1 | 11/2021 | Choi et al. | |
| 2022/0013502 | A1 | 1/2022 | Lee et al. | |
| 2022/0037273 | A1 | 2/2022 | Park et al. | |
| 2022/0077116 | A1 | 3/2022 | Park et al. | |
| 2022/0139881 | A1 | 5/2022 | Song et al. | |

* cited by examiner

STACK SEMICONDUCTOR PACKAGE

CROSS-REFERENCE TO RELATED APPLICATION

This application is based on and claims priority under 35 U.S.C. § 119 to Korean Patent Application No. 10-2022-0102948, filed on Aug. 17, 2022, in the Korean Intellectual Property Office, the disclosure of which is incorporated by reference herein in its entirety.

BACKGROUND

The inventive concepts relate to semiconductor packages, and more particularly, to stack semiconductor packages having a structure in which semiconductor chips are stacked.

Electronic devices are becoming smaller and lighter in accordance with the rapid development of the electronics industry and the needs of users. According to the miniaturization and weight reduction of electronic devices, semiconductor packages used therein are also becoming miniaturized and lightweight, and the semiconductor packages require high reliability together with high performance and high capacity. In order to realize miniaturization, light weight, high performance, high capacity, and high reliability, research and development on a semiconductor chip including a through silicon via (TSV) structure and a stacked semiconductor package in which the semiconductor chips are stacked have been continuously conducted.

SUMMARY

The inventive concepts are to provide stack semiconductor packages that have improved heat dissipation characteristics and could be easily manufactured.

Tasks to be solved by the inventive concepts are not limited to the above-mentioned tasks, and other tasks not mentioned herein will be clearly understood by one of ordinary skill in the art from the following description.

According to an aspect of the inventive concepts, there is provided a stack semiconductor package including a base chip, at least two semiconductor chips stacked on the base chip, and a sealing material sealing the at least two semiconductor chips on the base chip, wherein the at least two semiconductor chips comprise an uppermost semiconductor chip and at least one first semiconductor chip under the uppermost semiconductor chip, and the first semiconductor chip includes through electrodes arranged in a central portion of the first semiconductor chip, the central portion of the first semiconductor chip being a portion in a first direction on a plane defined by a first direction and a second direction perpendicular to the first direction, the central portion of the first semiconductor chip disposed centrally along the first direction, the through electrodes arranged along a the second direction perpendicular to the first direction, upper dummy pads on outer portions of a back side of the first semiconductor chip, the back side being a non-active surface of the first semiconductor chip, the outer portions being at both sides of the central portion in the first direction, and a dummy pattern connecting the upper dummy pads with each other on the back side.

According to another aspect of the inventive concepts, there is provided a stack semiconductor package including a package substrate, at least two semiconductor chips stacked on the package substrate. a sealing material sealing the at least two semiconductor chips on the package substrate, and an external connection terminal on a lower surface of the package substrate, wherein the at least two semiconductor chips including an uppermost semiconductor chip and at least one first semiconductor chip under the upper semiconductor chip, the first semiconductor comprising through electrodes arranged in a central portion of the first semiconductor chip, the central portion of the first semiconductor chip being a portion on a plane defined by a first direction and a second direction perpendicular to the first direction, the central portion of the first semiconductor chip disposed centrally along the first direction, the through electrodes arranged along the second direction, upper dummy pads on outer portions of a back side of the first semiconductor chip, the back side being a non-active surface of the first semiconductor chip, the both outer portions being at both sides of the central portion, respectively, in the first direction, and a dummy pattern connecting the upper dummy pads with each other on the back side.

According to another aspect of the inventive concepts, there is provided a stack semiconductor package including a buffer chip having first through electrodes, at least two semiconductor chips stacked on the buffer chip, and a sealing material sealing the at least two semiconductor chips on the buffer chip, wherein the at least two semiconductor chips comprise an uppermost semiconductor chip and at least one first semiconductor chip under the uppermost semiconductor chip, the first semiconductor chip including second through electrodes arranged in a central portion of the first semiconductor chip, the central portion of the first semiconductor chip being a portion on a plane defined by a first direction and a second direction perpendicular to the first direction, the central portion of the first semiconductor chip disposed centrally along the first direction, the second through electrodes arranged along the second direction, upper dummy pads on outer portions of a back side of the first semiconductor chip, the back side being a non-active surface of the first semiconductor chip, the outer portions being at both sides of the central portion, respectively, in the first direction, and a dummy pattern connecting the upper dummy pads with each other on the back side.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
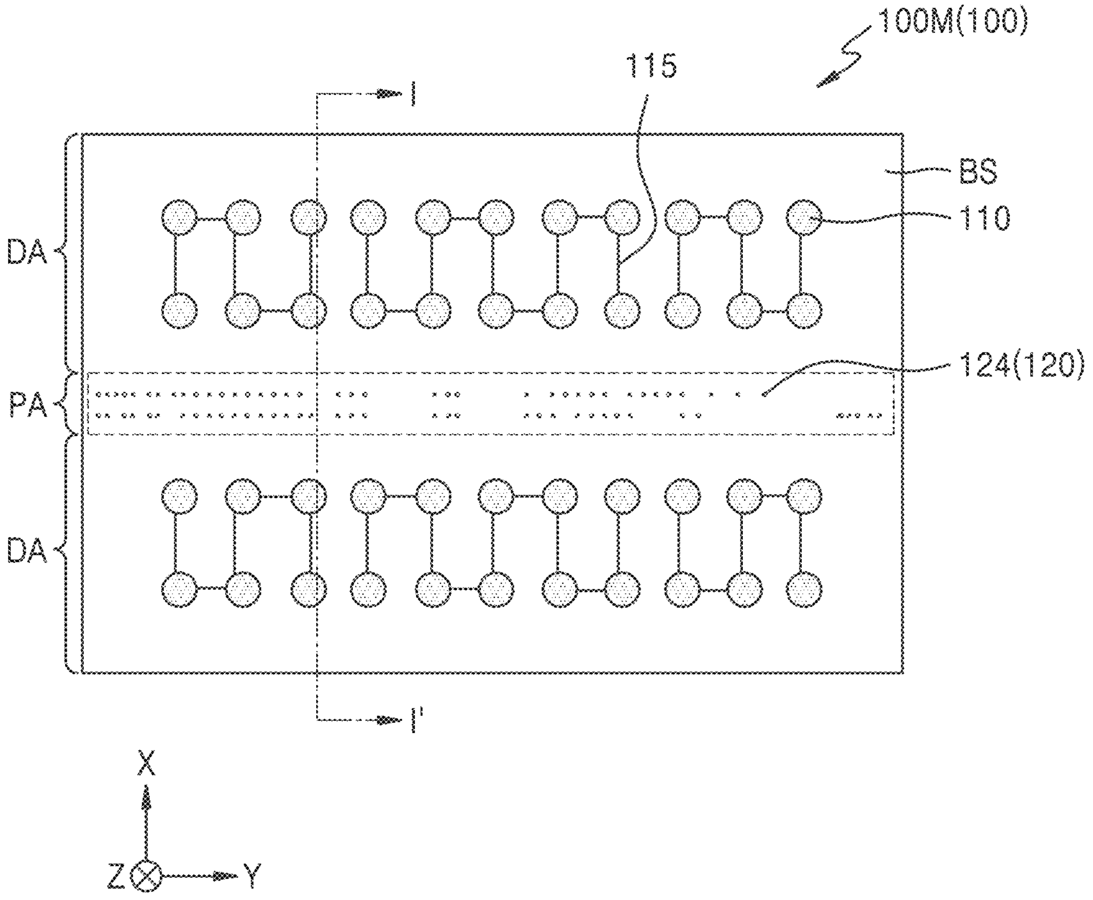
FIG. 1A is a plan view of a rear surface of any one of stacked semiconductor chips in a stack semiconductor package according to an example embodiment.

Hereinafter, some example embodiments of the inventive concepts will be described in detail with reference to the accompanying drawings. The same reference numerals are used for the same components in the drawings, and redundant descriptions thereof are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof.

Figure 1B:
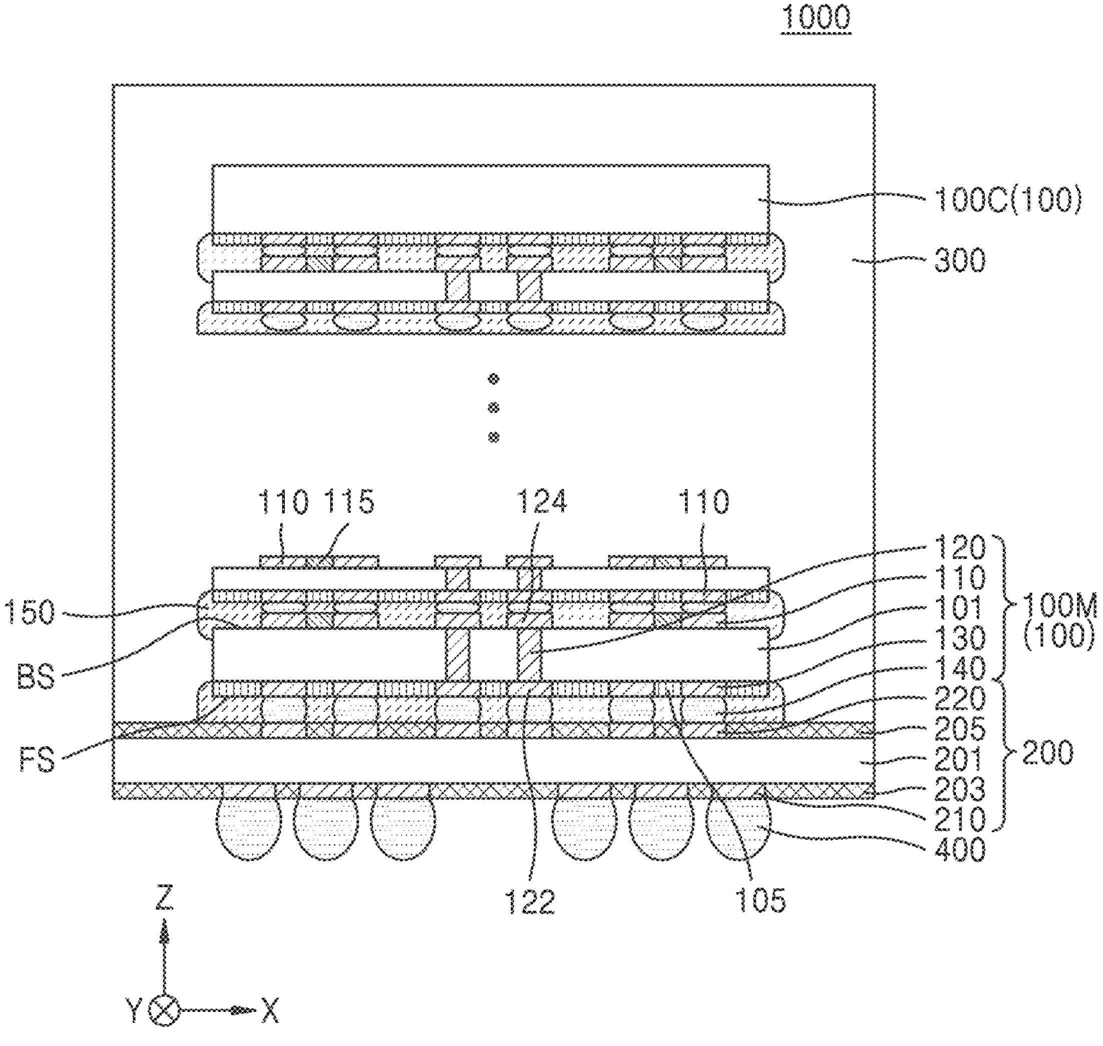
FIG. 1B is a cross-sectional view taken along an I-I' portion in the stack semiconductor package of FIG. 1A.

FIG. 1A is a plan view of a rear surface of any one of stacked semiconductor chips in a stack semiconductor package according to an example embodiment, and FIG. 1B is a cross-sectional view taken along a line I-I' portion in the stack semiconductor package of FIG. 1A.

Referring to FIGS. 1A and 1B, a stack semiconductor package 1000 of the example embodiment may include a package substrate 200, a semiconductor chip 100, and a sealing material 300.

The package substrate 200 may be a support substrate on which semiconductor chips 100 are mounted. The package substrate 200 may be formed based on, for example, a ceramic substrate, a printed circuit board (PCB), an organic substrate, an interposer substrate, or the like. In some example embodiments, the package substrate 200 may be formed based on an active wafer, such as a silicon wafer. In the stack semiconductor package 1000 of the example embodiment, the package substrate 200 may be, for example, a PCB. However, the package substrate 200 is not limited to a PCB.

The package substrate 200 may include a body layer 201, protective layers 203 and 205, and substrate pads 210 and 220. The body layer 201 may be formed in a thin shape by compressing phenol or epoxy glass (or FR-4) resin to a desired (or alternatively, predetermined) thickness. Wiring may be formed on both surfaces or one surface of the body layer 201. The wiring may be formed by patterning copper foil applied on both surfaces or one surface of the body layer 201. Meanwhile, wiring on the upper and lower surfaces of the body layer 201 may be electrically connected to each other through a via contact penetrating the body layer 201. Meanwhile, the body layer 201 may have a single-layer or multi-layer structure. In the case of a multi-layer structure, the body layer 201 may include prepreg insulating layers and may include wiring between the prepreg insulating layers. Accordingly, the body layer 201 may include three or more wiring layers.

The protective layers 203 and 205 may include a lower protective layer 203 on a lower surface of the body layer 201 and an upper protective layer 205 on an upper surface thereof. The protective layers 203 and 205 may cover and protect wiring on the upper and lower surfaces of the body layer 201. The protective layers 203 and 205 may be formed of, for example, a solder resist SR.

The substrate pads 210 and 220 may include a lower substrate pad 210 on a lower surface of the body layer 201 and an upper substrate pad 220 on an upper surface thereof. The lower substrate pad 210 may be connected to wiring on a lower surface of the body layer 201. In addition, the lower substrate pad 210 may penetrate the lower protective layer 203 and the lower surface thereof is exposed from the lower protective layer 203. The upper substrate pad 220 may be connected to a wiring on the upper surface of the body layer 201. In addition, the upper substrate pad 220 may penetrate the upper protective layer 205 and the upper surface thereof is exposed from the upper protective layer 205.

An external connection terminal 400, such as a bump or a solder ball, may be arranged on a lower surface of the package substrate 200. The external connection terminal 400 may mount the entire stack semiconductor package 1000 on an external system substrate, a main board, or the like. The external connection terminal 400 may be larger than a connection terminal 140 (e.g., a bump or a solder ball) arranged on the lower surface of the semiconductor chip 100. In addition, the pitch of the external connection terminal 400 may also be greater than the pitch of the connection terminal 140 of the semiconductor chip 100.

Semiconductor chips 100 may be mounted on the package substrate 200 in a stacked structure. The semiconductor chips 100 may be divided into, for example, a master chip 100M arranged lowermost and a core chip 100C arranged above the master chip 100M. In the stack semiconductor package 1000 of the example embodiment, there may be eight semiconductor chips 100. Accordingly, the semiconductor chips 100 may include one master chip 100M and seven core chips 100C. However, the number of semiconductor chips 100 stacked on the package substrate 200 is not limited to eight. In Stack semiconductor packages 1000 according to some example embodiments, two to seven or nine or more semiconductor chips 100 may be stacked, and the lowermost semiconductor chip 100 may be the master chip 100M.

To briefly explain the master chip 100M and the core chip 100C, the master chip 100M may mean a chip that generates a clock signal, and the core chip 100C may mean a chip that receives a clock signal generated from the master chip 100M. For example, the master chip 100M may read information from the core chip 100C or write information to the core chip 100C using a clock signal. In addition, the core chip 100C may respond to a request of the master chip 100M. The core chip 100C may be referred to as a slave chip.

The master chip 100M may include a clock generating device, a buffer memory device, and a memory device. Here, the buffer memory device or the memory device may include, for example, a Dynamic Random Access Memory (DRAM) device, a Static Random Access Memory (SRAM) device, a flash memory device, an Electrically Erasable and Programmable Read-Only Memory (EEPROM) device, a Phase-change Random Access Memory (PRAM) device, a Magnetic Random Access Memory (MRAM) device, or a Resistive Random Access Memory (RRAM) device. In the stack semiconductor package 1000 of the example embodiment, the memory device of the master chip 100M may be, for example, a DRAM device. However, the memory device of the master chip 100M is not limited to a DRAM device.

The core chip 100C may include a plurality of memory devices therein. The memory device may include, for example, a DRAM device, an SRAM device, a flash memory device, an EEPROM device, a PRAM device, an MRAM device, or an RRAM device. In the stack semiconductor package 1000 of the example embodiment, the memory device of the core chip 100C may be, for example, a DRAM device. However, the memory device of the core chip 100C is not limited to a DRAM device.

The master chip 100M and the core chip 100C may have different integrated circuits included therein, and as shown in FIG. 1B, the master chip 100M may be thicker than the core chip 100C. However, in some embodiments, the thicknesses of the master chip 100M and the core chip 100C may be the same as or substantially similar to one another. In addition, vertical cross-sectional structures of the master chip 100M and the core chip 100C may be the same or substantially similar to each other. Accordingly, hereinafter, the master chip 100M will be described.

The master chip 100M may include a body layer 101, an upper dummy pad 110, a dummy pattern 115, a through electrode 120, a lower dummy pad 130, and a connection terminal 140.

The body layer 101 may include a semiconductor substrate, an integrated circuit layer, a wiring layer, an interlayer insulating layer, and the like. Here, the semiconductor substrate may mean a silicon substrate. However, the semiconductor substrate is not limited to a silicon substrate. For example, the semiconductor substrate may include other semiconductor elements, such as germanium (Ge), or compound semiconductors, such as silicon carbide (SiC), gallium acetate (GaAs), indium acetate (InAs), or indium phosphide (InP).

The integrated circuit layer may include a clock generating device, a buffer memory device, and a memory device. The wiring layer is arranged under the integrated circuit layer and may include an insulating layer and multi-layered wirings. For reference, in each of the master chips 100M and the core chips 100C, the lower surface thereof may correspond to a front side (FS), which is an active surface, and the upper surface thereof may correspond to a back side (BS), which is an inactive surface.

The through electrode 120 may be arranged in a pad area PA of the master chip 100M. As shown in FIG. 1A, the master chip 100M may include a pad area PA arranged at a central part, which is on an X-Y plane in a first direction (X direction), and dummy areas DAs arranged at both outer parts (e.g., at both sides of the pad area PA) in the first direction (X direction). Accordingly, the through electrode 120 may be arranged at the center portion of the master chip 100M in the first direction (X direction). In addition, as shown in FIGS. 1A and 1B, through electrodes 120 may be arranged in the second direction (Y direction) in two rows. In other words, the through electrodes 120 may be arranged in a central portion (e.g., the pad area PA) of the master chip 100M. The central portion (e.g., the pad area PA) of the master chip 100M refers to a portion on the X-Y plane that are disposed centrally along the first direction (X direction). The through electrodes 120 may be arranged in at least one row along the second direction. However, the number of rows of the through electrodes 120 is not limited to two. For example, the through electrodes 120 may be in one or three or more rows and may be arranged in the second direction (Y direction).

The through electrodes 120 may penetrate a silicon portion constituting the body layer 101 of the master chip 100M. Accordingly, each of the through electrodes 120 may be referred to as a through silicon via (TSV). For example, in the stack semiconductor package 1000 of the example embodiment, each of the through electrodes 120 may have a via-middle structure. However, example embodiments are not limited thereto, and each of the through electrodes 120 may have a via-first or via-last structure. Here, the via-first structure refers to a structure in which the through electrode is formed before the integrated circuit layer is formed, the via-middle structure refers to a structure in which the through electrode is formed before the wiring layer is formed after the integrated circuit layer is formed, and the via-last structure may refer to a structure in which the through electrode is formed after the wiring layer is formed. In the example embodiment, in the stack semiconductor package 1000, the through electrode 120 may extend to the wiring layer through the integrated circuit layer portion due to the via-middle structure.

A lower surface of each of the through electrodes 120 may be connected to the lower electrode pad 122, and an upper surface thereof may be connected to the upper electrode pad 124. In FIG. 1B, for convenience of illustration, the lower surface of the through electrode 120 is shown as being directly connected to the lower electrode pad 122, but in practice, the lower surface of the through electrode 120 may be connected to the lower electrode pad 122 through the wiring layer. However, in some example embodiments, the through electrode 120 may be formed in a via-last structure, in which case the lower surface of the through electrode 120 may be directly connected to the lower electrode pad 122. Meanwhile, as shown in FIG. 1B, the upper electrode pad 124 may be directly arranged on the upper surface of the through electrode 120.

The lower protective layer 105 may be arranged on the lower surface of the master chip 100M, and the lower electrode pad 122 may penetrate the lower protective layer 105 and the lower surface thereof may be exposed from the lower protective layer 105. In addition, an upper protective layer is arranged on the upper surface of the master chip 100M, but is not shown for convenience in FIG. 1B.

The upper dummy pad 110 may be arranged on the back side BS, which is an inactive surface of the master chip 100M. In addition, the upper dummy pad 110 may be arranged in the dummy area DA of the master chip 100M. Accordingly, the upper dummy pad 110 may be arranged at both outer portions of the master chip 100M in the first direction (X direction). In addition, as shown in FIGS. 1A and 1B, the upper dummy pads 110 may be provided in two rows each arranged in the second direction (Y direction). However, the number of rows of upper dummy pads 110 is not limited to two. For example, the upper dummy pads 110 may be in one or three or more rows and may be arranged in the second direction (Y direction).

In the stack semiconductor package 1000 according to the example embodiment, at least three of the upper dummy pads 110 may be connected to each other through a dummy pattern 115 in at least one of the first direction (X direction), the second direction (Y direction), and the diagonal direction between the first direction (X direction) and the second direction (Y direction). Referring to FIG. 1A, an arrangement structure of the upper dummy pads 110 and a connection relationship through the dummy pattern 115 are described in more detail. In a stack semiconductor package 1000 of the example embodiment, the upper dummy pads 110 may be provided in two rows each arranged in the second direction (Y-direction) in each of dummy regions DA. In addition, the two upper dummy pads 110 adjacent to each other in the first direction (X direction) may be connected to each other through the dummy pattern 115. Meanwhile, the two upper dummy pads 110 adjacent to each other in the first row in the second direction (Y direction) and the two upper dummy pads 110 adjacent to each other in the second row may be alternately connected to each other through the dummy pattern 115, along the second direction (Y direction).

In addition, the upper dummy pads 110 may be divided into several groups. Here, the groups may be separated from each other without being connected. For example, in FIG. 1A, in each of the dummy areas DAs, the upper dummy pads 110 may be divided into three groups. In addition, the groups may be spaced apart from each other in the second direction (Y direction). A test pad, a power pad, or the like may be arranged at portions spaced apart between the groups. In FIG. 1A, a separation interval between the upper dummy pads 110 in the group in the second direction (Y direction) and a separation interval between the groups may be the same. However, according to example embodiments, the separation interval between the groups may be greater than the separation interval between the upper dummy pads 110 in the group.

The upper dummy pad 110 may be formed together when the upper electrode pad 124 is formed on the through electrode 120. Accordingly, the upper dummy pad 110 and the upper electrode pad 124 may have the same or substantially similar structure and material. For example, the upper dummy pad 110 and the upper electrode pad 124 may include at least one of aluminum (Al), copper (Cu), nickel (Ni), tungsten (W), platinum (Pt), and gold (Au). In the stack semiconductor package 1000 of the example embodiment, the upper dummy pad 110 and the upper electrode pad 124 may include an Au electrode and a Ni plating layer. Meanwhile, the dummy pattern 115 is also formed when the upper dummy pad 110 is formed, and may include an Au electrode and a Ni plating layer. Of course, materials of the upper dummy pad 110, the dummy pattern 115, and the upper electrode pad 124 are not limited to the above-described materials. The formation of the upper dummy pad 110 and the dummy pad 115 will be described in more detail with reference to FIGS. 8A to 8H. Meanwhile, although the sizes of the upper electrode pad 124 and the upper dummy pad 110 are differently illustrated in FIG. 1A, this is to emphasize an arrangement structure of the upper dummy pads 110 and a connection relationship thereof, and the upper electrode pad 124 and the upper dummy pad 110 may have the same or substantially similar size.

The lower dummy pad 130 may be arranged on the front side FS, which is an active surface of the master chip 100M. In addition, the lower dummy pad 130 may be arranged in the dummy area DA of the master chip 100M. Accordingly, the lower dummy pad 130 may be arranged at both outer portions of the master chip 100M, the both outer portions being portions at both side of a central portion of the master chip 100M in the first direction (X direction). In addition, the lower dummy pad 130 may be arranged at a portion corresponding to the upper dummy pad 110. Accordingly, the lower dummy pad 130 may be arranged on the front side FS of the master chip 100M with the arrangement structure shown in FIG. 1A. In some example embodiments, the lower dummy pads 130 may not be connected to each other. In other words, a dummy pattern may not be arranged on the front side FS of the master chip 100M. However, in some other example embodiments, the lower dummy pads 130 may be connected to each other via a dummy pattern like the upper dummy pads 110. Meanwhile, the lower dummy pad 130 may be formed together when the lower electrode pad 122 connected to the through electrode 120 is formed. Accordingly, the lower dummy pad 130 and the lower electrode pad 122 may have the same or substantially similar structure and material. For example, the lower dummy pad 130 and the lower electrode pad 122 may include an Au electrode and a Ni plating layer.

The connection terminals (e.g., a bump or a solder ball) 140 may be arranged on the lower electrode pad 122 and the lower dummy pad 130. The connection terminals 140 may be arranged on lower surfaces of the lower electrode pad 122 and the lower dummy pad 130. The connection terminal 140 may be connected to the through electrode 120 through the lower electrode pad 122. Meanwhile, the lower dummy pad 130 may not be connected to an integrated circuit inside the master chip 100M. Accordingly, the connection terminal 140 on the lower dummy pad 130 may not perform an electrical role, but may perform a role of dissipating heat and supporting the semiconductor chip 100 arranged on the upper portion thereof.

The connection terminal 140 may be formed of a conductive material, for example, copper (Cu), aluminum (Al), silver (Ag), tin (Tin), gold (Au), or solder. However, the material of the connection terminal 140 is not limited thereto. Meanwhile, the connection terminal 140 may be formed as a multilayer or a single layer. For example, when the connection terminal 140 is formed as a multilayer, the connection terminal 140 may include a copper filler and a solder. When formed as a single layer, the connection terminal 140 may include tin-silver solder or copper.

The master chip 100M may be stacked and fixed on the package substrate 200 through the connection terminal 140 and an adhesive layer 150. According to an example embodiment, an underfill may be used instead of the adhesive layer 150. Meanwhile, the core chip 100C may also be stacked and fixed on the master chip 100M or another core chip 100C arranged below the core chip 100C through the connection terminal 140 and the adhesive layer 150. In addition, in the case of the core chip 100C, similar to the master chip 100M as described above, a through electrode, an upper dummy pad, a dummy pattern, and a lower dummy pad may be included in the core chip 100C. However, as illustrated in FIG. 1B, in the case of the core chip 100C arranged uppermost, the through electrode may not be included in the core chip 100C, and the upper dummy pad and the dummy pattern may not be also included therein, The sealing material 300 may cover and seal the semiconductor chip 100 and the adhesive layer 150 on the package substrate 200. The sealing material 300 may seal the semiconductor chip 100 to protect the semiconductor chip 100 from external physical and chemical damage. The sealing material 300 may be formed of, for example, an epoxy molding compound (EMC). However, the sealing material 300 is not limited to an EMC and may be formed of various materials, such as epoxy-based materials, thermosetting materials, thermoplastic materials, and ultra-violet (UV) curable materials. In addition, the sealing material 300 may be formed of a resin and may contain a filler. Meanwhile, the sealing material 300 may be formed through a mold under fill (MUF) process. As illustrated in FIG. 1B, the sealing material 300 may have a structure covering an upper surface of the semiconductor chip 100 arranged uppermost. However, the sealing material 300 is not limited thereto, and the sealing material 300 may have a structure that does not cover the upper surface of the uppermost semiconductor chip 100. That is, the top surface of the uppermost semiconductor chip 100 may be exposed from the sealing material 300.

In the stack semiconductor package 1000 of the example embodiment, each of the semiconductor chips 100 may include the upper dummy pads 110 and the dummy pattern 115 arranged on the back side BS. In addition, the adjacent upper dummy pads 110 may be connected to each other through the dummy pattern 115. Due to the upper dummy pads 110 and the dummy pattern 115, which are arranged in this way, heat dissipation may proceed smoothly, thereby improving the operating characteristics and reliability of the stack semiconductor package 1000. Heat dissipation characteristics will be described in more detail with reference to FIGS. 2A and 2B.

In addition, the upper dummy pads 110 and the dummy pattern 115 are arranged on the back side of the semiconductor chip 100 and may be formed together through the same semiconductor process when the upper electrode pad 124 is formed on the upper surface of the through electrode 120. Accordingly, the upper dummy pads 110 and the dummy pattern 115 may be easily formed without affecting the integrated circuit inside the semiconductor chip 100. Thus, the operation characteristics and reliability of the stack semiconductor package 1000 may be improved without increasing the manufacturing cost.

Figure 2A:
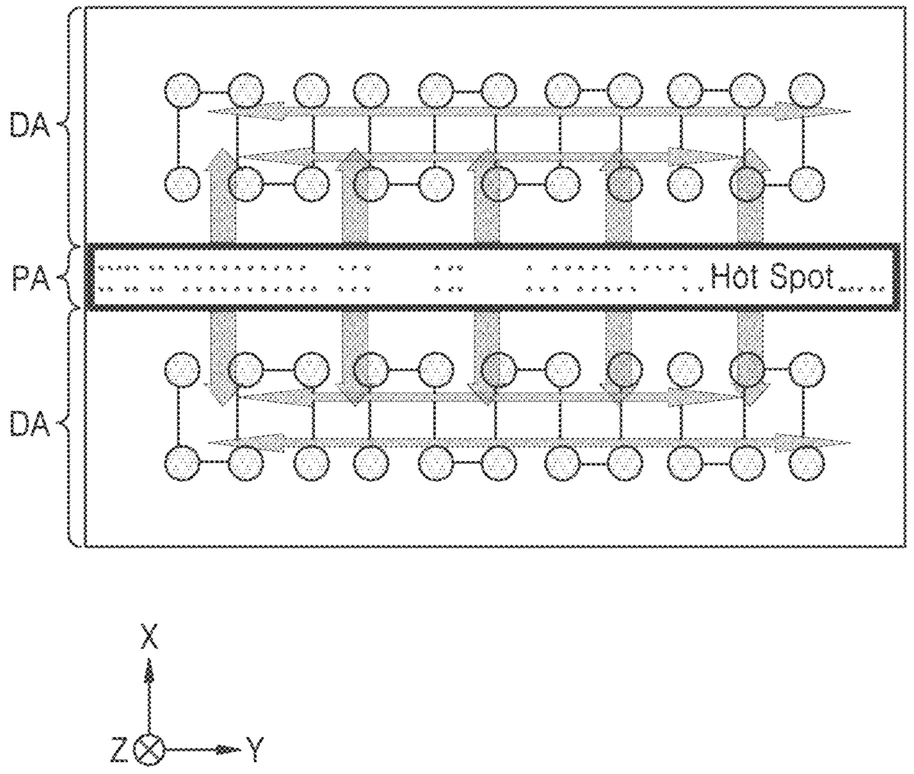
FIGS. 2A and 2B are a plan view and a cross-sectional view illustrating a heat dissipation path in the stack semiconductor package of FIGS. 1A and 1B.
Figure 2B:
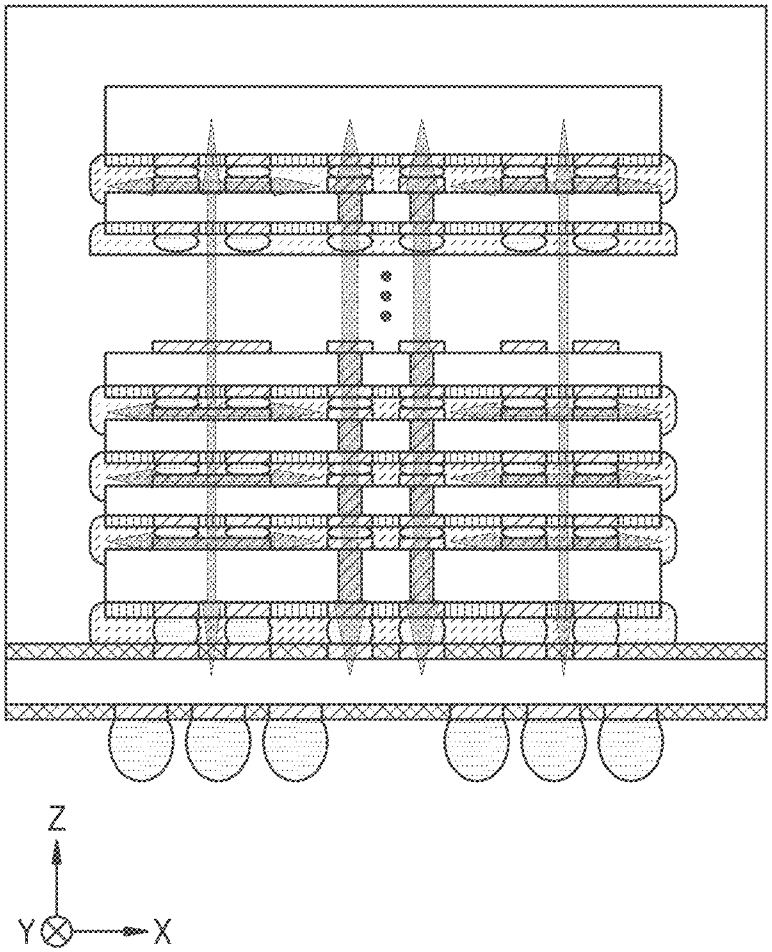

FIGS. 2A and 2B are a plan view and a cross-sectional view illustrating a heat dissipation path in the stack semiconductor package 1000 of FIGS. 1A and 1B.

Referring to FIG. 2A, FIG. 2A shows a planar heat dissipation path in the stack semiconductor package 1000 (e.g., the master chip 100M) of the example embodiment. Heat generated in the pad area PA indicated by "Hot Spot" may be transferred to the upper dummy pads 110 of the dummy areas DAs on both sides in the first direction (X direction), as indicated by bold arrows. Subsequently, heat may be transferred and spread to both sides in the second direction (Y direction) through the upper dummy pads 110, as indicated by bidirectional thin arrows in the dummy areas DAs.

Referring to FIG. 2B, FIG. 2B illustrates a vertical heat dissipation path in a cross-section in the stack semiconductor package 1000 of the example embodiment. Heat generated in the pad area PA where the through electrode 120 is placed may be transferred in a vertical direction along the through electrode 120 as indicated by bold arrows in the vertical direction. In addition, heat may be transmitted and spread from each semiconductor chip 100 as indicated by thin arrows in the horizontal direction. Meanwhile, in the case of each semiconductor chip 100, as described with reference to FIG. 2A, heat may be transferred and spread in the second direction (Y direction). Meanwhile, because the semiconductor chip 100 includes silicon and silicon transfers heat relatively well, heat may be transferred and spread in the vertical direction from the dummy areas DAs, as indicated by thin arrows in the vertical direction.

In the stack semiconductor package 1000 of this example embodiment, the heat dissipation efficiency of the entire stack semiconductor package 1000 may be greatly improved by rapidly transferring heat from each of the semiconductor chips 100 in the horizontal direction through the upper dummy pads 110 and the dummy pattern 115, which are arranged on the back side of each of the semiconductor chips 100.

Figure 3:
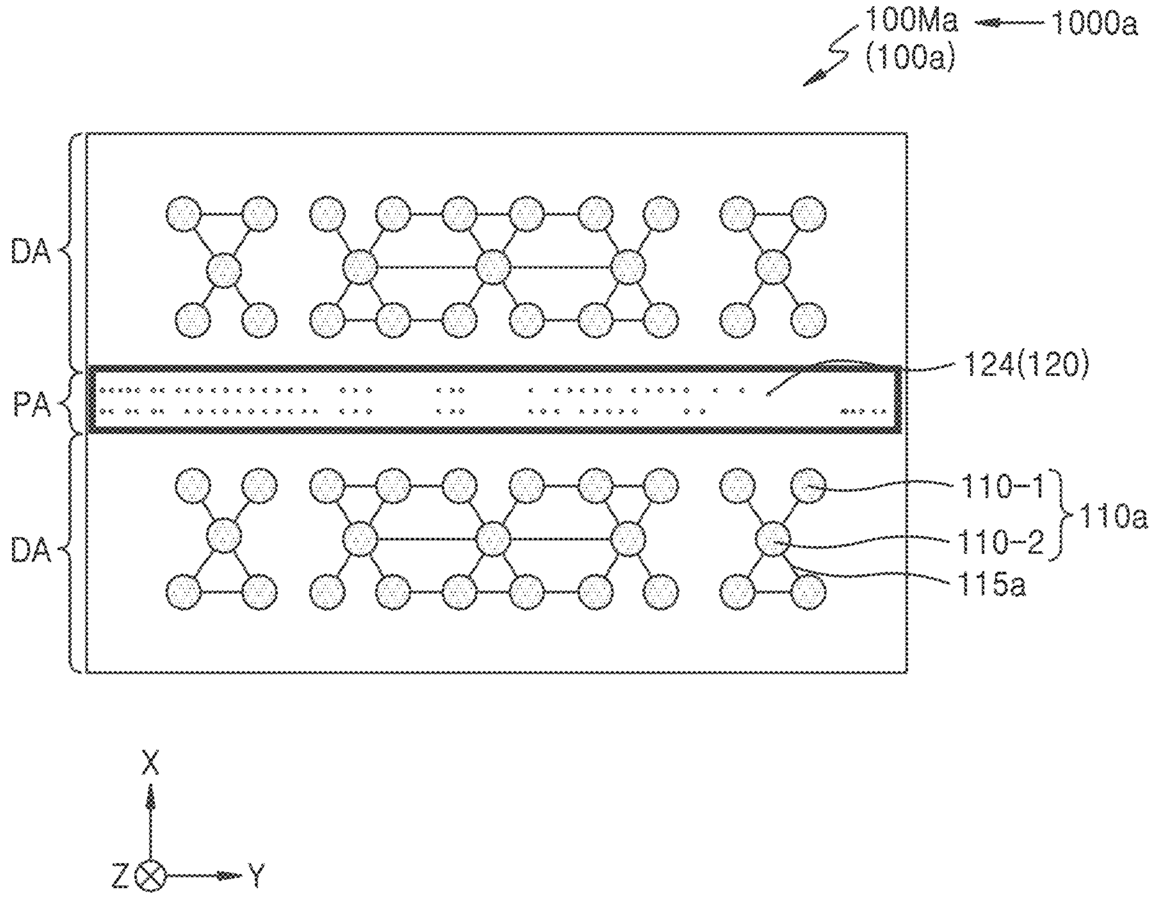
FIGS. 3 to 5 are plan views illustrating a rear surface of a semiconductor chip in a stack semiconductor package according to some example embodiments.
Figure 4:
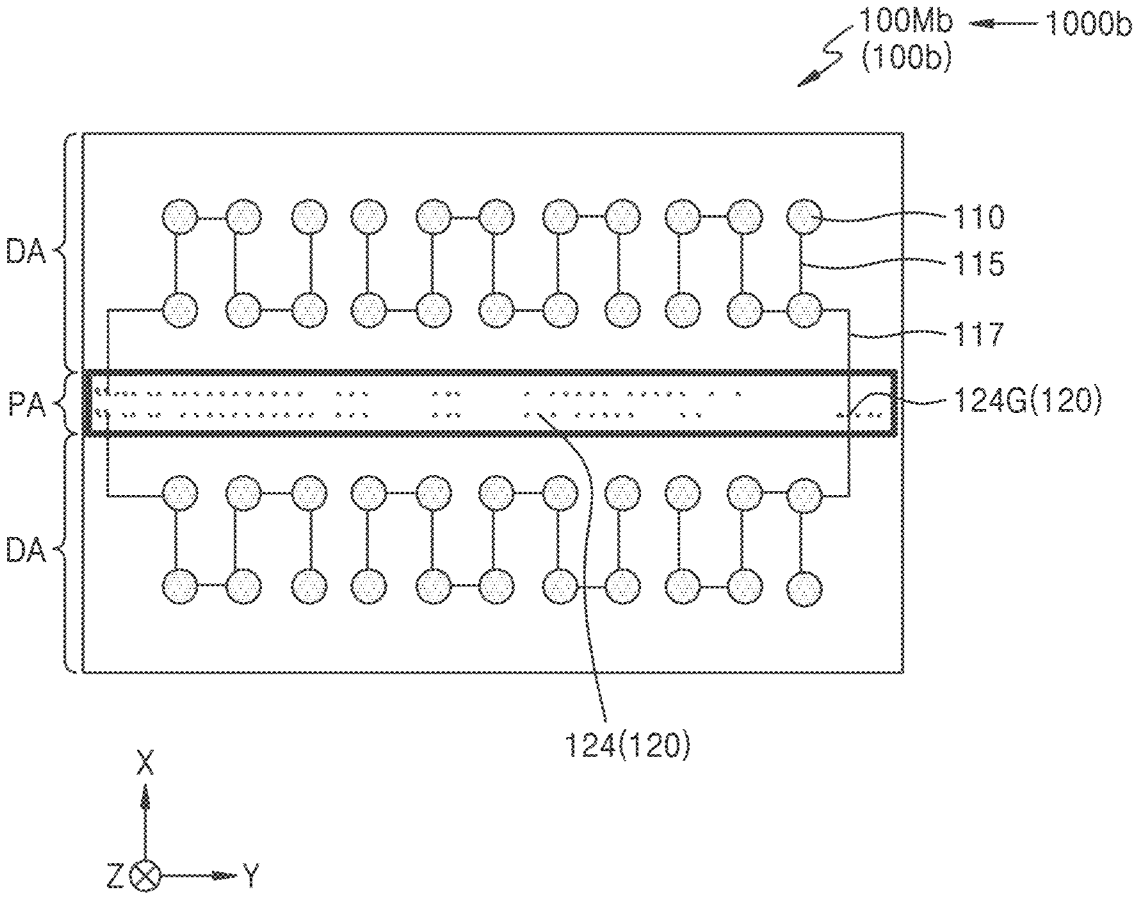
Figure 5:
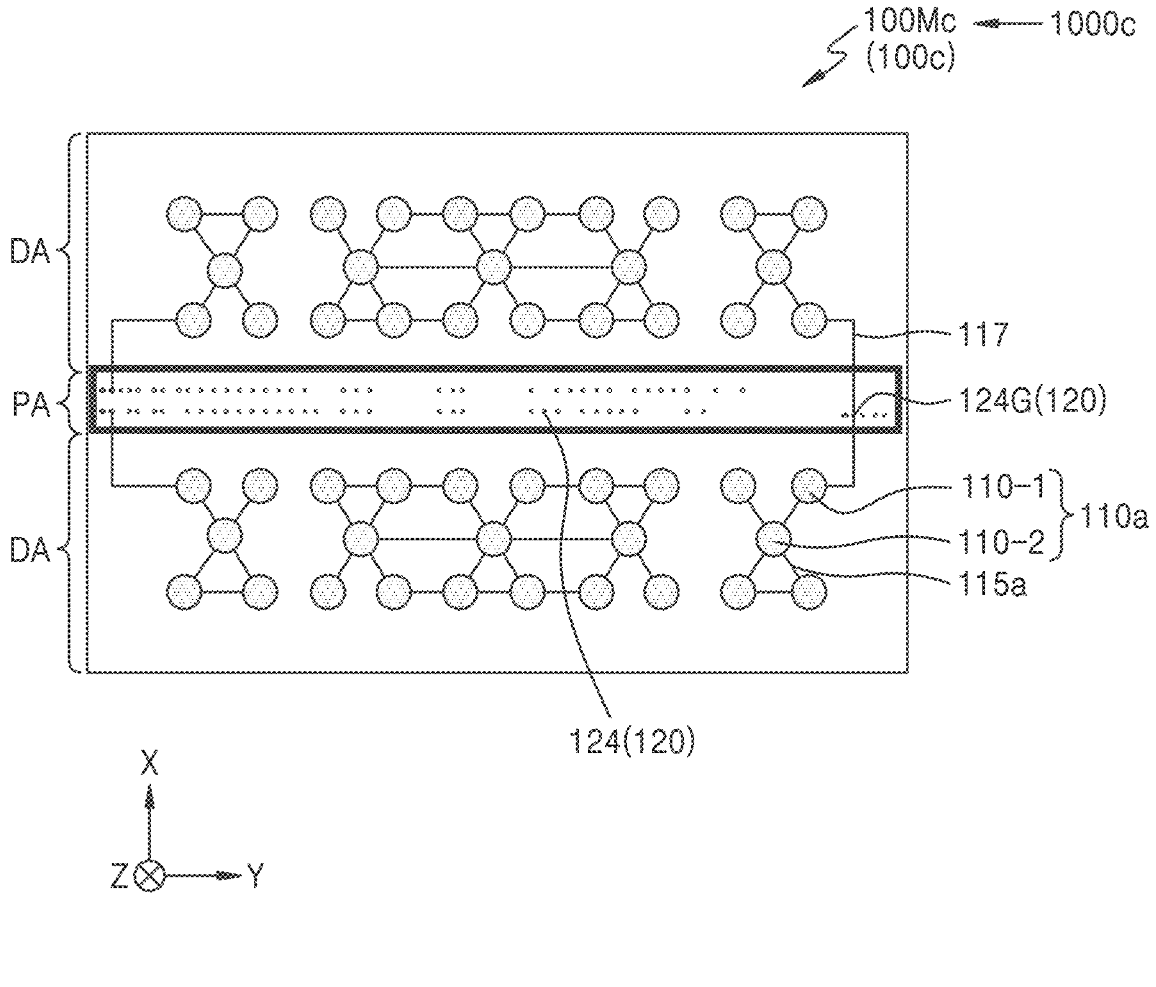

FIGS. 3 to 5 are plan views illustrating a rear surface of a semiconductor chip in a stack semiconductor package according to some example embodiments, which correspond to FIG. 1A. The example embodiments will be described with reference to FIGS. 3 to 5 together with FIG. 1B, and the description previously given with reference to FIGS. 1A to 2B will be briefly given or omitted.

Referring to FIG. 3, a stack semiconductor package 1000*a* of an example embodiment may be different from the stack semiconductor package 1000 of FIG. 1A in a connection structure between upper dummy pads 110*a* and a dummy pattern 115*a*, which are arranged on the back side of a semiconductor chip 100*a*. In the stack semiconductor package 1000*a* of this example embodiment, in the semiconductor chip 100*a*, such as a master chip 100Ma, the upper dummy pads 110*a* may include first upper dummy pads 110-1 arranged at four rectangular vertices and second upper dummy pads 110-2 arranged at the center of the rectangle. In addition, in the diagonal directions between the first direction (X direction) and the second direction (Y direction), the second upper dummy pads 110-2 may be connected to the first upper dummy pads 110-1, respectively, through the dummy pattern 115*a*.

Meanwhile, the upper dummy pads 110*a* arranged in a rectangular shape may be repeatedly arranged in the second direction (Y direction). In addition, at least a pair of first upper dummy pads 110-1 adjacent to each other in the second direction (Y direction) may be connected to each other through the dummy pattern 115*a*. In some example embodiments, all pairs of two adjacent first upper dummy pads 110-1 may be connected to each other through the dummy pattern 115*a*. Furthermore, at least a pair of the upper dummy pads 110-2 adjacent to each other in the second direction (Y direction) may be connected to each other through the dummy pattern 115*a*. In some embodiments, all pairs of two adjacent second upper dummy pads 110-2 may be connected to each other through the dummy pattern 115*a*.

In addition, even in the stack semiconductor package 1000*a* of the embodiment, the upper dummy pads 110*a* may be divided into several groups. For example, in FIG. 3, in each of the dummy areas DAs, the upper dummy pads 110*a* may be divided into three groups. In addition, the groups may be spaced apart from each other in the second direction (Y direction). A test pad, a power pad, or the like may be arranged at portions spaced apart (e.g., at spaces) between the groups. In FIG. 3, a separation interval between upper dummy pads 110*a* in the group, for example, the first upper dummy pads 110-1, and a separation interval between the groups may be the same in the second direction (Y direction). However, according to example embodiments, the separation interval between the groups may be greater than the separation interval between the first upper dummy pads 110-1 in the group.

Referring to FIG. 4, a stack semiconductor package 1000*b* of the example embodiment may be different from the stack semiconductor package 1000 of FIG. 1A in that FIG. 4 further includes an additional dummy pattern 117. In the stack semiconductor package 1000*b* of the example embodiment, upper dummy pads 110, a dummy pattern 115, and an additional dummy pattern 117 may be arranged on the back side of a semiconductor chip 100*b* (e.g., a master chip 100Mb). The upper dummy pads 110 and the dummy pattern 115 are the same as those described for the upper dummy pads 110 and the dummy pattern 115 of the master chip 100M of the stack semiconductor package 1000 of FIG. 1A.

Meanwhile, the additional dummy pattern 117 may connect the upper dummy pad 110 to the through electrode 120 connected to the ground. More specifically, the additional dummy pattern 117 may connect the upper dummy pads 110 to the upper electrode pad 124G, to which is the through electrode 120 connected to the ground is connected. For example, the through electrode 120 connected to the ground may be arranged at an end portion of the semiconductor chip 100*b* (e.g., at an end portion of the pad area PA, which is arranged in the second direction (Y direction). Accordingly, the additional dummy pattern 117 may also be arranged at the outer portion of the dummy area DA in the second direction (Y direction). However, depending on example embodiments, the through electrode 120 connected to the ground may be placed in the center of the pad area PA in the second direction (Y direction), and in such a case, the additional dummy pattern 117 may also be placed in the center of the dummy area DA in the second direction (Y direction).

Referring to FIG. 5, a stack semiconductor package 1000*c* of the example embodiment may be different from the stack semiconductor package 1000*a* of FIG. 3 in that FIG. 5 further includes an additional dummy pattern 117. In the stack semiconductor package 1000*c* of the example embodiment, upper dummy pads 110*a*, a dummy pattern 115*a*, and an additional dummy pattern 117 may be arranged on the back side of a semiconductor chip 100*c* (e.g., a master chip 100Mc). The upper dummy pads 110*a* and the dummy pattern 115*a* are the same as those described for the upper dummy pads 110*a* and the dummy pattern 115*a* of the master chip 100Ma of the stack semiconductor package 1000*a* of FIG. 3.

Meanwhile, the additional dummy pattern 117 may connect the upper dummy pad 110*a* to the through electrode 120 connected to the ground. For example, the additional dummy pattern 117 may connect the upper dummy pads 110*a* to the upper electrode pad 124G to which the through electrode 120 connected to the ground is connected. The additional dummy pattern 117 may also be arranged at an end portion of the dummy area DA, which is arranged in the second direction (Y direction). However, according to example embodiments, the additional dummy pattern 117 may be arranged at the central portion of the dummy area DA.

Up to this point, an arrangement structure of the upper dummy pads and a connection structure by the dummy pattern have been described through some example embodiments, but the inventive concepts are not limited to the above-described example embodiments. For example, various arrangement structures of upper dummy pads arranged on the back side of a semiconductor chip and various connection structures by dummy patterns between upper dummy pads may also be included in the inventive concepts.

Figure 6:
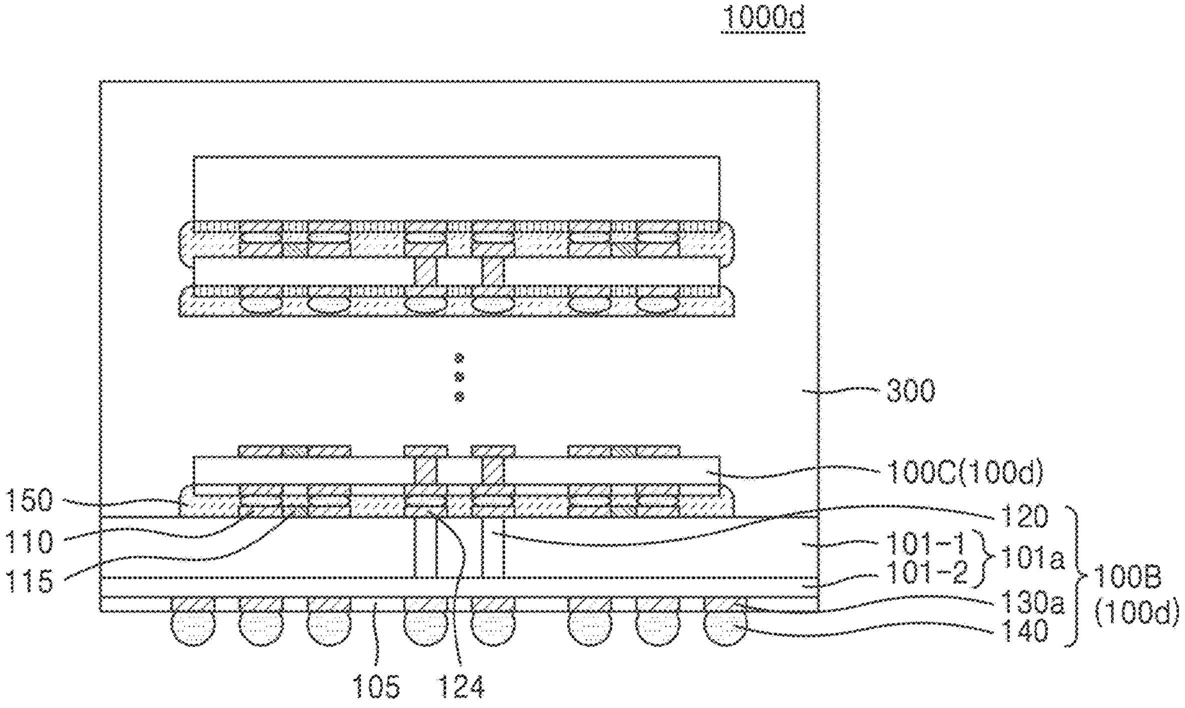
FIG. 6 is a cross-sectional view of a stack semiconductor package according to an example embodiment.

FIG. 6 is a cross-sectional view of a stack semiconductor package according to an example embodiment. Descriptions already given with reference to FIGS. 1A to 5 will be briefly given or omitted.

Referring to FIG. 6, a stack semiconductor package 1000*d* of the example embodiment may be different from the stack semiconductor package 1000 of FIG. 1B in that the stack semiconductor package 1000*d* may include a buffer chip 100B instead of the package substrate 200 and semiconductor chips 100*d* on the buffer chip 100B are all core chips 100C. In other words, the stack semiconductor package 1000*d* of the example embodiment may include the buffer chip 100B, the core chip 100C, and a sealing material 300.

The buffer chip 100B may be arranged lowermost in the stack semiconductor package 1000*d*. The buffer chip 100B may be larger in size than the core chips 100C arranged thereon. However, the size of the buffer chip 100B is not limited thereto. For example, the buffer chip 100B may have the same or substantially similar size as each of the core chips 100C.

The buffer chip 100B may include a body layer 101*a*, through electrodes 120, lower electrode pads 130*a*, and connection terminals 140. The body layer 101*a* is the same, for example, as described with respect to the body layer 101 in the master chip 100M of the stack semiconductor package 1000 of FIG. 1B. However, in the buffer chip 100B of FIG. 6, the body layer 101*a* is divided into a first body layer 101-1 including an integrated circuit layer and a second body layer 101-2 including a wiring layer. Because the lower electrode pads 130*a* are not dummy pads, the lower electrode pads 130*a* are connected to the wirings in the second body layer 101-2.

Meanwhile, the first body layer 101-1 including the integrated circuit layer may include a plurality of logic elements. Accordingly, the buffer chip 100B may be referred to as a logic chip or a control chip. The buffer chip 100B may be arranged below the core chips 100C to integrate signals of the core chips 100C and transmit the integrated signals to the outside, and also to transmit signals and power from the outside to the core chips 100C. According to some example embodiments, the buffer chip 100B may include a buffer memory device and a general memory device.

The through electrodes 120 are also the same as described with respect to the through electrodes 120 in the master chip 100M in the stack semiconductor package 1000 of FIG. 1B. However, in the case of the buffer chip 100B according to the example embodiment, the through electrode 120 may not be arranged only in the center region in the first direction (X direction), but may be arranged over the entire surface of the buffer chip 100B.

A lower surface of each of the through electrodes 120 may be connected to the lower electrode pad 130*a*, and an upper surface thereof may be connected to the upper electrode pad 124. As shown in FIG. 6, the lower surface of each of the through electrodes 120 may be connected to the second body layer 101-2, and may be connected to the lower electrode pads 130*a* through wiring in the second body layer 101-2. Meanwhile, as shown in FIG. 6, the upper electrode pad 124 may be directly arranged on the upper surface of the through electrode 120. Although not illustrated, a protective layer may be formed on an upper surface of the body layer 101*a*, and the upper electrode pad 124 may penetrate the protective layer and be connected to the through electrode 120.

Meanwhile, the upper dummy pads 110 and the dummy pattern 115 may be arranged on the back side of the buffer chip 100B. In addition, two adjacent upper dummy pads 110 may be connected to each other through the dummy pattern 115. The arrangement structure of the upper dummy pads 110 and the connection relationship by the dummy pattern 115 are the same as described in the stack semiconductor packages 1000 and 1000*a* to 1000*c* of FIGS. 1A and 3 to 5. Meanwhile, in some example embodiments, the upper dummy pads and the dummy pattern may not be arranged on the back side of the buffer chip 100B.

The connection terminals 140 may be arranged on the lower electrode pads 130*a* of the lower surface of the buffer chip 100B, respectively. For example, the connection terminals 140 may be electrically connected to the through electrode 120 through the lower electrode pads 130*a* and wirings of the second body layer 101-2.

The core chips 100C may be stacked and fixed on the buffer chip 100B or another core chip 100C arranged below the buffer chip 100B through the connection terminals 140 and an adhesive layer 150. The core chip 100C is a concept relative to the buffer chip 100B. The core chip 100C may include a plurality of memory devices. For example, the memory device may include a volatile memory device, such as DRAM or SRAM, or a nonvolatile memory device, such as PRAM, MRAM, FeRAM, or RRAM. In the stack semiconductor package 1000*d* of the example embodiment, the core chip 100C may be a high bandwidth memory (HBM) chip including DRAM devices. Accordingly, the stack semiconductor package 1000*d* of the example embodiment may be an HBM package.

In the stack semiconductor package 1000*d* of the example embodiment, eight core chips 100C are stacked, but the number of stacked core chips 100C is not limited to eight. For example, two to seven or nine or more core chips 100C may be stacked on the buffer chip 100B. Each of the core chips 100C may be the same as or substantially similar to the core chip 100C in the stack semiconductor package 1000 of FIG. 1B.

The sealing material 300 may cover the core chips 100C and the adhesive layer 150 on the buffer chip 100B. The description of the sealing material 300 is the same as that of the sealing material 300 of the stack semiconductor package 1000 of FIG. 1B.

Figure 7A:
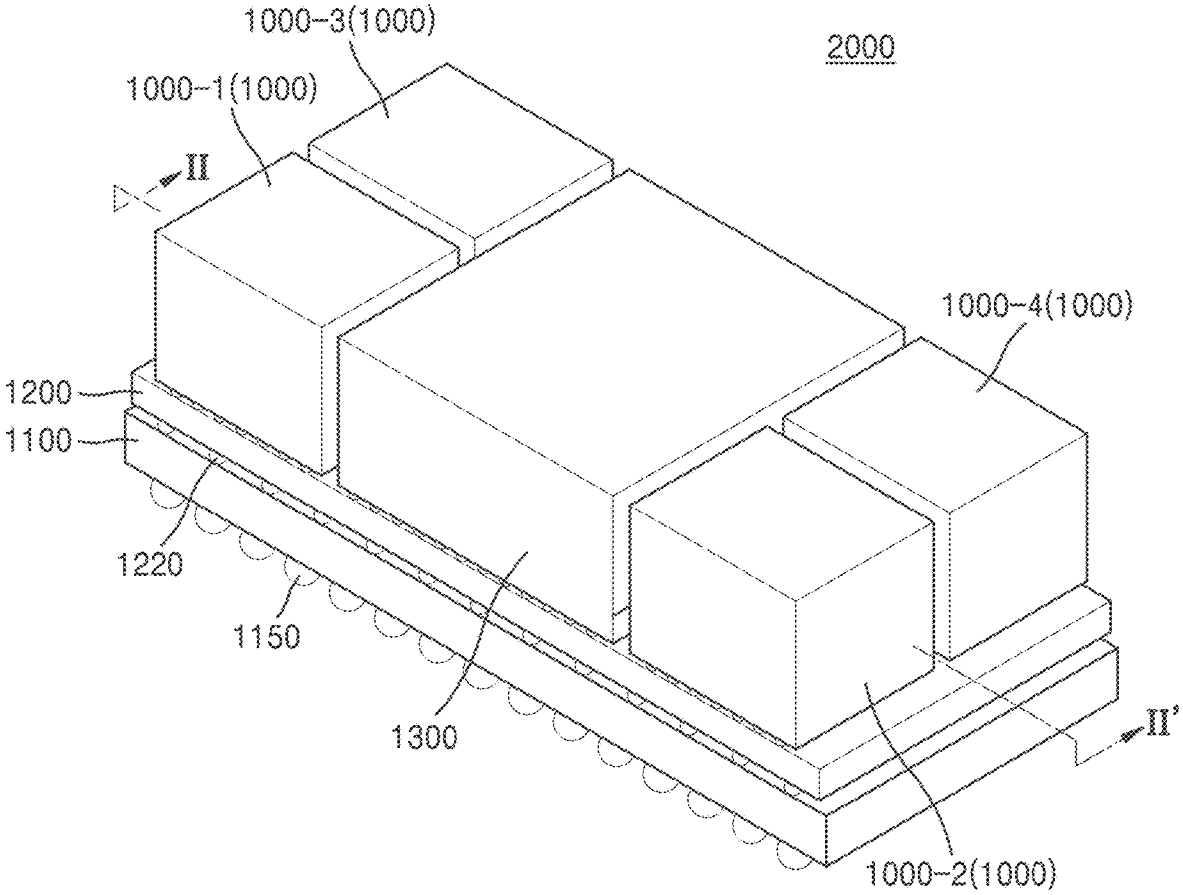
FIGS. 7A and 7B are a perspective view and a cross-sectional view of a system package including a stack semiconductor package according to an example embodiment.
Figure 7B:
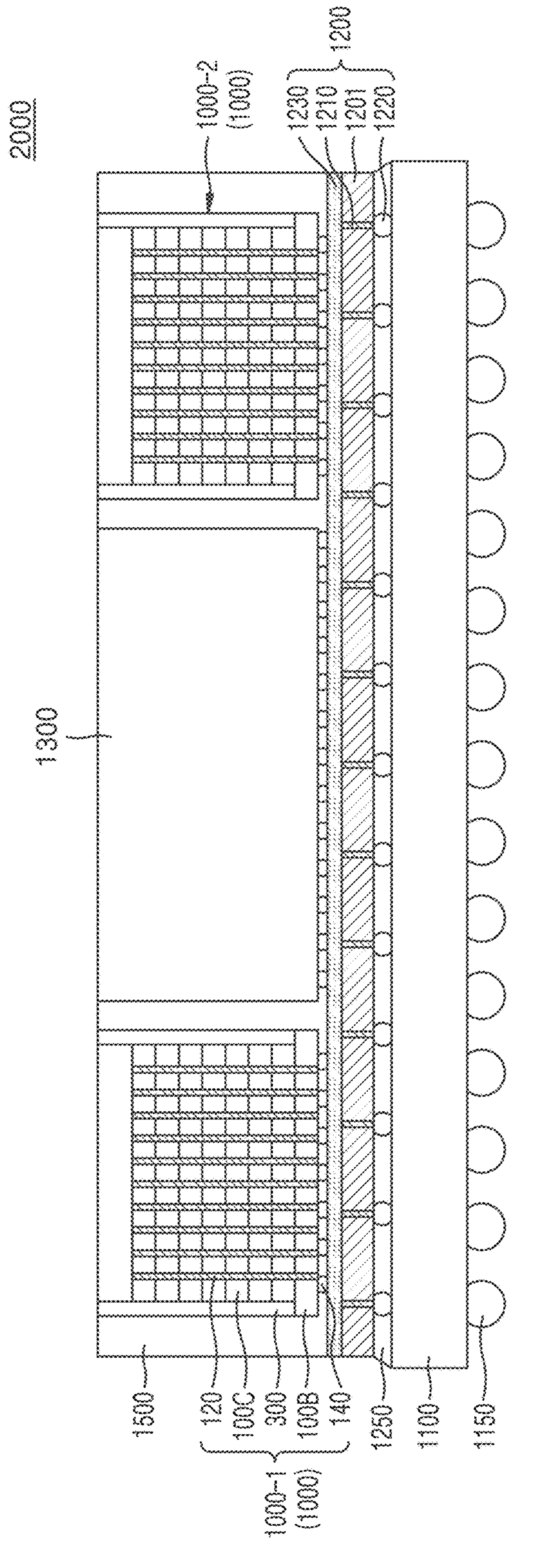

FIGS. 7A and 7B are a perspective view and a cross-sectional view of a system package including a stack semiconductor package according to an example embodiment. FIG. 7B is a cross-sectional view taken along a line II-II' of FIG. 7A, and in FIG. 7A, an outer sealing material is omitted. This example embodiment will be described with reference to FIG. 6 together with FIG. 7B, and the description previously given with reference to FIGS. 1A to 6 will be briefly given or omitted.

Referring to FIGS. 7A and 7B, a system package 2000 including the stack semiconductor package of the example embodiment (hereinafter, simply referred to as a system package) may include stack semiconductor packages 1000, a package substrate 1100, a silicon (Si) interposer 1200, a first semiconductor chip 1300, and an external sealing material 1500.

As shown in FIG. 7A, four stack semiconductor packages 1000 may include first to fourth stack semiconductor packages 1000-1 to 1000-4, and two of the four stack semiconductor packages 1000 may be arranged on the Si interposer 1200, on each side of the first semiconductor chip 1300. However, in the system package 2000 of the example embodiment, the number of stack semiconductor packages 1000 is not limited to four. For example, one to three or five or more stack semiconductor packages 1000 may be arranged on the Si interposer 1200.

The stack semiconductor package 1000 may be, for example, the stack semiconductor package 1000*d* of FIG. 6. Accordingly, the stack semiconductor package 1000 may be, for example, an HBM package. Thus, the stack semiconductor package 1000 may include a buffer chip 100B and a plurality of core chips 100C on the buffer chip 100B, and the buffer chip 100B and the core chips 100C may include through electrodes 120 therein. The buffer chip 100B and the core chips 100C are the same as those described in the description of the stack semiconductor package 1000*d* of FIG. 6.

Although not illustrated in FIG. 7B, upper dummy pads 110 and a dummy pattern 115 may be arranged on the back side of the buffer chip 100B and on the back side of at least some of the core chips 100C. Meanwhile, the uppermost core chip 100C among the core chips 100C may not include the through electrode 120 and may not also include the upper dummy pads 110 and the dummy pattern 115 on the back side thereof.

The stack semiconductor packages 1000 may be stacked on the Si interposer 1200 through the connection terminal 140 on the lower surface of the buffer chip 100B. The core chips 100C on the buffer chip 100B may be sealed by an inner sealing material 300. As illustrated in FIG. 7B, the upper surface of the uppermost core chip 100C among the core chips 100C may not be covered by the inner sealing material 300. In some example embodiments, the upper surface of the uppermost core chip 100C may be covered by the inner sealing material 300. The inner sealing material 300 may correspond to the sealing material 300 in the stack semiconductor package 1000*d* of FIG. 6.

The package substrate 1100 is a support substrate on which the Si interposer 1200, the stack semiconductor package 1000, and the first semiconductor chip 1300 are mounted, and may include at least one wiring layer therein. When the wiring is formed in multiple layers, the wirings of different layers may be connected to each other through via contacts. The package substrate 1100 may be formed based on, for example, a ceramic substrate, PCB, an organic substrate, or an interposer substrate. The package substrate 1100 may have a structure and function similar to the package substrate 200 of the stack semiconductor package 1000 of FIG. 1B, except for a size thereof. External connection terminals 1150 such as bumps or solder balls may be arranged on a lower surface of the package substrate 1100. The external connection terminals 1150 may be configured to mount the system package 2000 on an external system substrate, a main board, and the like.

The Si interposer 1200 may include a substrate 1201, through electrodes 1210, connection terminals 1220, and wiring layers 1230. The first semiconductor chip 1300 and the stack semiconductor packages 1000 may be stacked on the package substrate 1100 via the Si interposer 1200. The Si interposer 1200 may electrically connect the first semiconductor chip 1300 and the stack semiconductor packages 1000 to the package substrate 1100.

The substrate 1201 of the Si interposer 1200 may be formed from, for example, a silicon substrate. The through electrodes 1210 may extend through the substrate 1201. Because the substrate 1201 is based on a silicon substrate, the through electrodes 1210 may be referred to as TSVs. The through electrodes 1210 may extend to the wiring layer 1230 to be electrically connected to the wirings of the wiring layer 1230. According to some example embodiments, the Si interposer 1200 may include only a wiring layer therein and may not include through electrodes. The wiring layer 1230 may be arranged on an upper surface or a lower surface of the substrate 1201. For example, the positional relationship between the wiring layer 1230 and the through electrodes 1210 may be relative. The upper pads of the Si interposer 1200 may be connected to the through electrodes 1210 through the wiring layer 1230.

The connection terminals 1220 may be arranged on the lower surface of the Si interposer 1200 and electrically connected to the through electrodes 1210. The Si interposer 1200 may be stacked on the package substrate 1100 through the connection terminals 1220. The connection terminals 1220 may be connected to the upper pads of the Si interposer 1200 through the through electrodes 1210 and wirings of the wiring layer 1230. For reference, the upper pads used for power or ground, among the upper pads of the Si interposer 1200, may be integrated and connected together to the connection terminals 1220. Accordingly, the number of connection terminals 1220 may be less than the number of upper pads.

In the system package 2000 according to the example embodiment, the Si interposer 1200 may be used for converting or transmitting an electrical signal between the first semiconductor chip 1300 and the stack semiconductor package 1000. Accordingly, the Si interposer 1200 may not include devices, such as active devices or passive devices. Meanwhile, an underfill 1250 may be filled between the Si interposer 1200 and the package substrate 1100 and between the connection terminals 1220. In some example embodiments, the underfill 1250 may be replaced with an adhesive film. In addition, when a molded underfill (MUF) process is performed on the package substrate 1100, the underfill 1250 may be omitted.

The first semiconductor chip 1300 may be arranged at a central portion of the Si interposer 1200. The first semiconductor chip 1300 may be a logic chip. Accordingly, the first semiconductor chip 1300 may include a plurality of logic elements therein. The logic elements may include, for example, elements, such as an AND, a NAND, an OR, a NOR, an exclusive OR (XOR), an exclusive NOR (XNOR), an inverter (INV), an adder (ADD), a delay (DLY), a filter (FIL), a multiplexer (MXT/MXIT). an OR/AND/INVERTER (OAI), an AND/OR (AO), an AND/OR/INVERTER (AOI), a D flip-flop, a reset flip-flop, a master-slave flip-flop, a latch, a counter, or a buffer. The logic elements may perform various signal processing, such as analog signal processing, analog-to-digital conversion, and control. The first semiconductor chip 1300 may be referred to as a Graphics Processing Unit (GPU) chip, a Central Processing Unit (CPU) chip, a System On Glass (SOG) chip, a Micro Micro-Processor Unit (MPU) chip, an Application Processor (AP) chip, a control chip, or the like according to functions thereof.

The external sealing material 1500 may cover and seal the first semiconductor chip 1300 and the stack semiconductor package 1000 on the Si interposer 1200. As illustrated in FIG. 7B, the external sealing material 1500 may not cover the upper surfaces of the first semiconductor chip 1300 and the stack semiconductor package 1000. However, in other embodiments, the external sealing material 1500 may cover at least one upper surface of the first semiconductor chip 1300 and the stack semiconductor package 1000. Meanwhile, although not shown, the system package 2000 of the example embodiment may further include a second external sealing material for sealing the Si interposer 1200 and the external sealing material 1500 on the package substrate 1100.

For reference, the structure of the system package 2000 as in the example embodiment may be referred to as a two-point-five dimensional (2.5D) package structure, and the 2.5D package structure may be a relative concept to a three dimensional (3D) package structure in which all semiconductor chips are stacked together and there is no Si interposer. Both the 2.5D package structure and the 3D package structure may be included in a system in package (SIP) structure.

FIGS. 8A to 8H are cross-sectional views schematically illustrating a method of manufacturing the stack semiconductor package of FIG. 1B. This example embodiment will be described with reference to FIGS. 8A to 8H together with FIGS. 1A and 1B, and the description previously given with reference to FIGS. 1A to 7B will be briefly given or omitted.

Figure 8A:
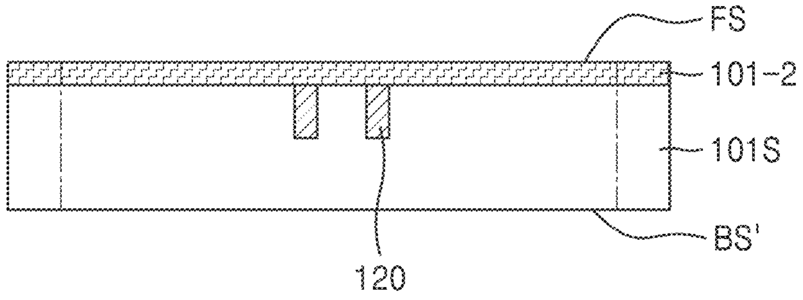
FIGS. 8A to 8H are cross-sectional views schematically illustrating a method of manufacturing the stack semiconductor package of FIG. 1B.

Referring to FIG. 8A, in the method of manufacturing a stack semiconductor package, according to an example embodiment, through electrodes 120 are formed in a silicon substrate 101S. The silicon substrate 101S may correspond to a body layer 101 of each of a plurality of semiconductor chips 100, which will be described later. For example, the silicon substrate 101S may be a silicon wafer.

Each of the through electrodes 120 may be formed in a via-middle structure. In other words, an integrated circuit layer may be first formed in the silicon substrate 101S, and then, the through electrodes 120 may be formed. The through electrodes 120 may be formed in a pad area PA. Subsequently, a wiring layer 101-2 may be formed on the through electrodes 120. For reference, the wiring layer 101-2 may correspond to a second body layer (see 101-2 of FIG. 6) including wirings. Accordingly, the upper surface of the wiring layer 101-2 may correspond to a front side FS having an active surface, and the lower surface of the silicon substrate 101S may correspond to a back side BS' having an inactive surface.

Meanwhile, when the master chip 100M is manufactured using the silicon substrate 101S, the integrated circuit layer may include a clock generating device, a buffer memory device, a memory device, and the like. In addition, when a core chip 100C is manufactured using the silicon substrate 101S, the integrated circuit layer may include a plurality of memory devices.

Figure 8B:
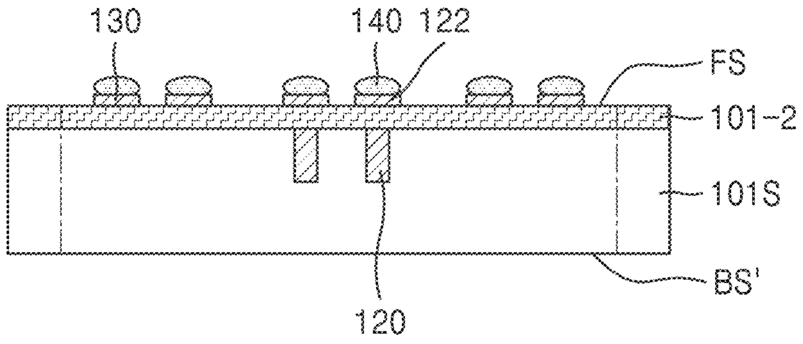

Referring to FIG. 8B, after the through electrodes 120 and the wiring layer 101-2 are formed, lower electrode pads 122 are formed in the pad area PA on the wiring layer 101-2. The lower electrode pads 122 may be connected to the through electrodes 120 through the wiring layer 101-2. Meanwhile, when the lower electrode pads 122 are formed, lower dummy pads 130 may also be formed. The lower dummy pads 130 may be formed in dummy areas DAs on the wiring layer 101-2.

Subsequently, connection terminals 140 are respectively formed on the lower electrode pads 122 and the lower dummy pads 130. For reference, the connection terminal 140 on each of the lower dummy pads 132 may dissipate heat and support the upper semiconductor chips without performing an electrical role. As described above, the lower electrode pads 122 and the lower dummy pads 130 are formed through the same semiconductor process, and thus may include the same or substantially similar structure and material. For example, the lower electrode pads 122 and the lower dummy pads 130 may include an Au electrode and a Ni plating layer. In addition, since because connection terminals 140 respectively on the lower electrode pads 122 and the connection terminals 140 respectively on the lower dummy pads 130 are formed by the same semiconductor process, they may include the same or substantially similar structure and material. For example, the connection terminals 140 may include, for example, a Cu filler and a solder.

Figure 8C:
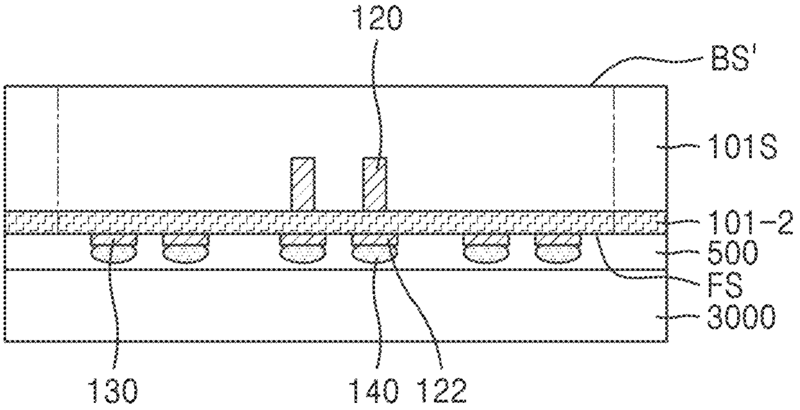

Referring to FIG. 8C, the silicon substrate 101S is then turned upside down and adhered and fixed on a carrier substrate 3000 through an adhesive tape 500. That is, the lower electrode pads 122, the lower dummy pads 130, and the connection terminals 140, which are arranged on the wiring layer 101-2 may be adhered to the adhesive tape 500. The adhesive tape 500 may be a debonding tape that could be easily detached. For example, the adhesive tape 500 may be a UV tape that may be easily detached by ultra-violet (UV) irradiation.

Figure 8D:
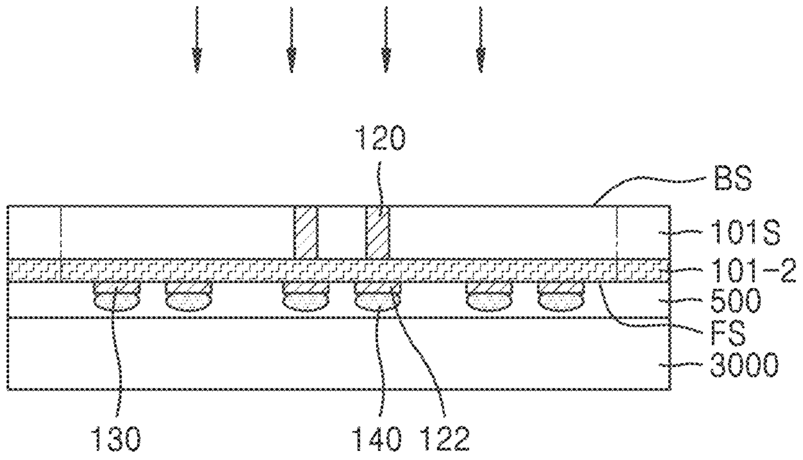

Referring to FIG. 8D, as indicated by arrows, the back side BS' part of the silicon substrate 101S is removed to make the silicon substrate 101S thinner. The removal of the back side BS' of the silicon substrate 101S may be performed by chemical mechanical polishing (CMP). By removing the back side BS' part of the silicon substrate 101S, the upper surfaces of the through electrodes 120 may be exposed on the back side BS of the silicon substrate 101S.

Figure 8E:
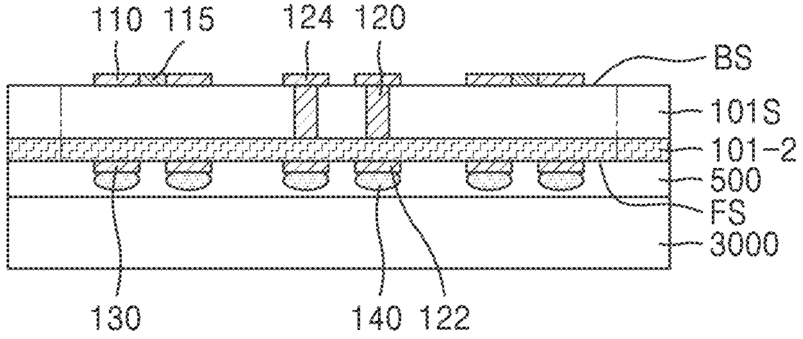

Referring to FIG. 8E, upper electrode pads 124 are formed in the pad area PA on the back side BS of the silicon substrate 101S. Meanwhile, although not illustrated, a protective layer may be formed on the back side BS of the silicon substrate 101S, and the upper electrode pads 124 may penetrate the protective layer and be connected to the through electrodes 120. Meanwhile, when the upper electrode pads 124 are formed, the upper dummy pads 110 may also be formed. In addition, a dummy pattern 115 connecting adjacent upper dummy pads 110 may also be formed. The upper dummy pads 110 and the dummy pattern 115 may be formed in the dummy areas DAs. As described above, the upper electrode pads 124, the upper dummy pads 110, and the dummy pattern 115 may be formed through the same semiconductor process. Accordingly, the upper electrode pads 124 and the upper dummy pads 110 may include the same or substantially similar structure and material. For example, the upper electrode pads 124 and the upper dummy pads 110 may include an Au electrode and a Ni plating layer. Meanwhile, because the dummy pattern 115 is also formed by the same semiconductor process, the dummy pattern 115 may include an Au electrode and a Ni plating layer.

Figure 8F:
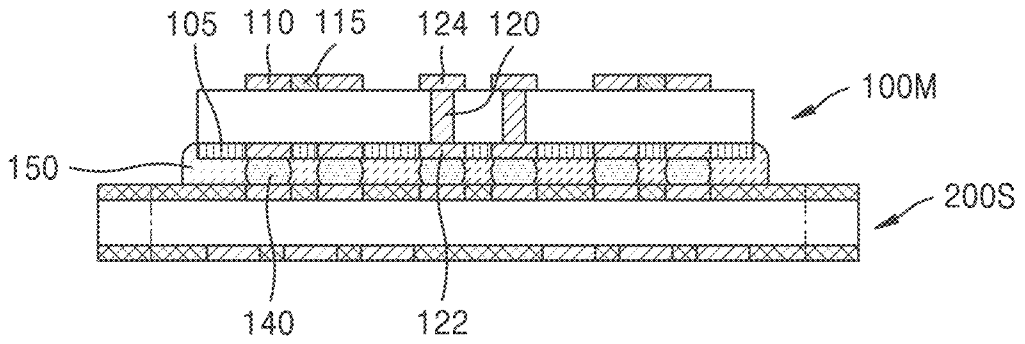

Referring to FIG. 8F, the number of semiconductor chips 100 included in the silicon substrate 101S are then separated into individual semiconductor chips 100 through a singulation process. The separated semiconductor chip 100 may be, for example, a master chip 100M or a core chip 100C, depending on the elements in the integrated circuit layer.

Subsequently, the semiconductor chip 100, for example, the master chip 100M, is stacked on a large package substrate 200S. The large package substrate 200S may include a plurality of package substrates 200. The master chip 100M may be stacked and fixed on a corresponding package substrate 200 of the large package substrate 200S through the connection terminals 140 and the adhesive layer 150.

Figure 8G:
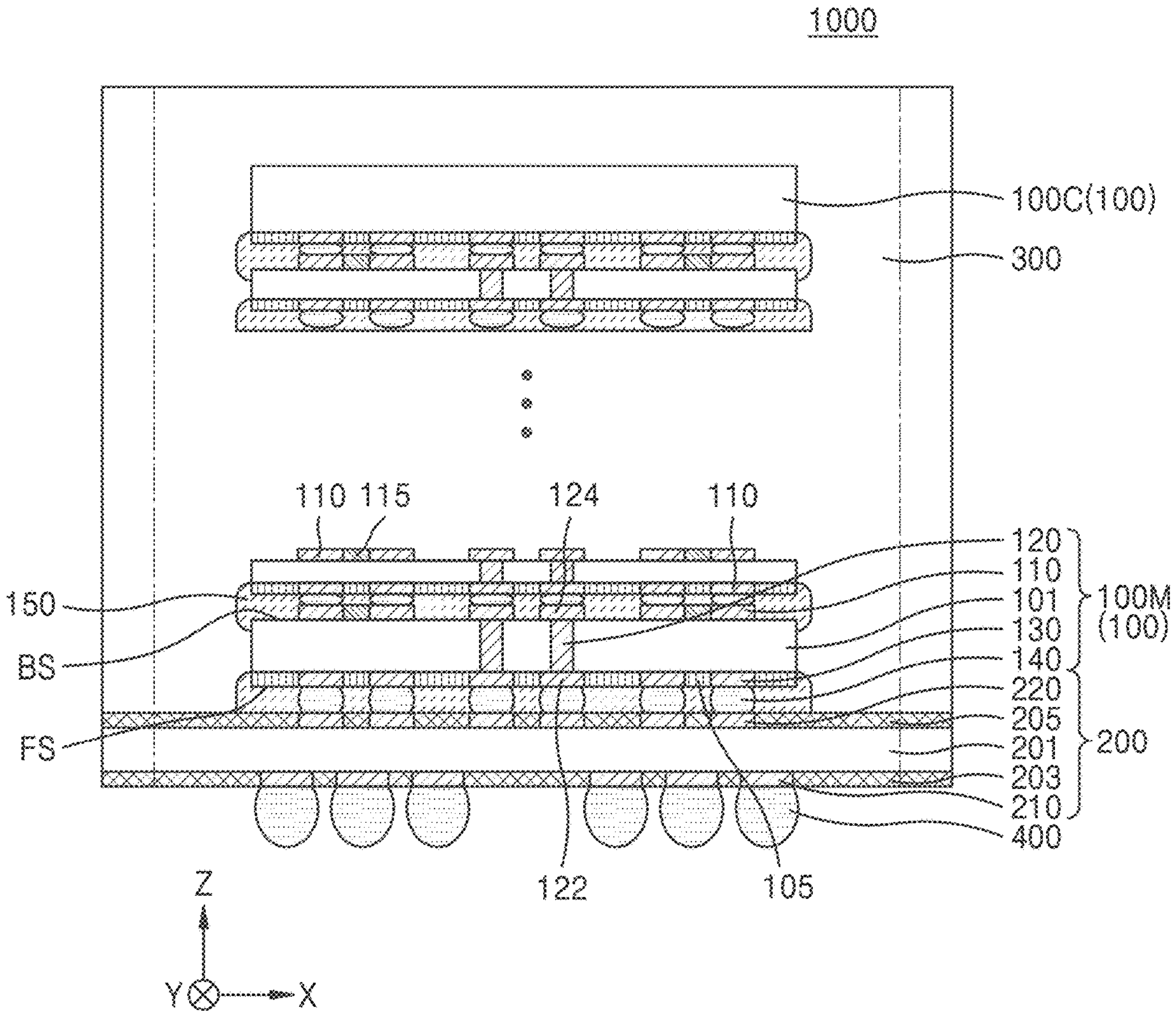

Referring to FIG. 8G, thereafter, core chips 100C may be stacked on the master chip 100M. Each of the core chips 100C may be stacked and fixed on the lower master chip 100M or another core chip 100C through the connection terminals 140 and the adhesive layer 150. In the stack semiconductor package 1000 of the example embodiment, eight core chips 100C may be stacked on the master chip 100M. However, the number of core chips 100C stacked on the master chip 100M is not limited to eight.

Subsequently, a sealing material 300 covering the semiconductor chips 100 on the large package substrate 200S is formed. The sealing material 300 may be formed in a structure that entirely covers the large package substrate 200S. The material of the sealing material 300 is the same as that described with respect to the sealing material 300 of the stack semiconductor package 1000 of FIG. 1B.

Figure 8H:
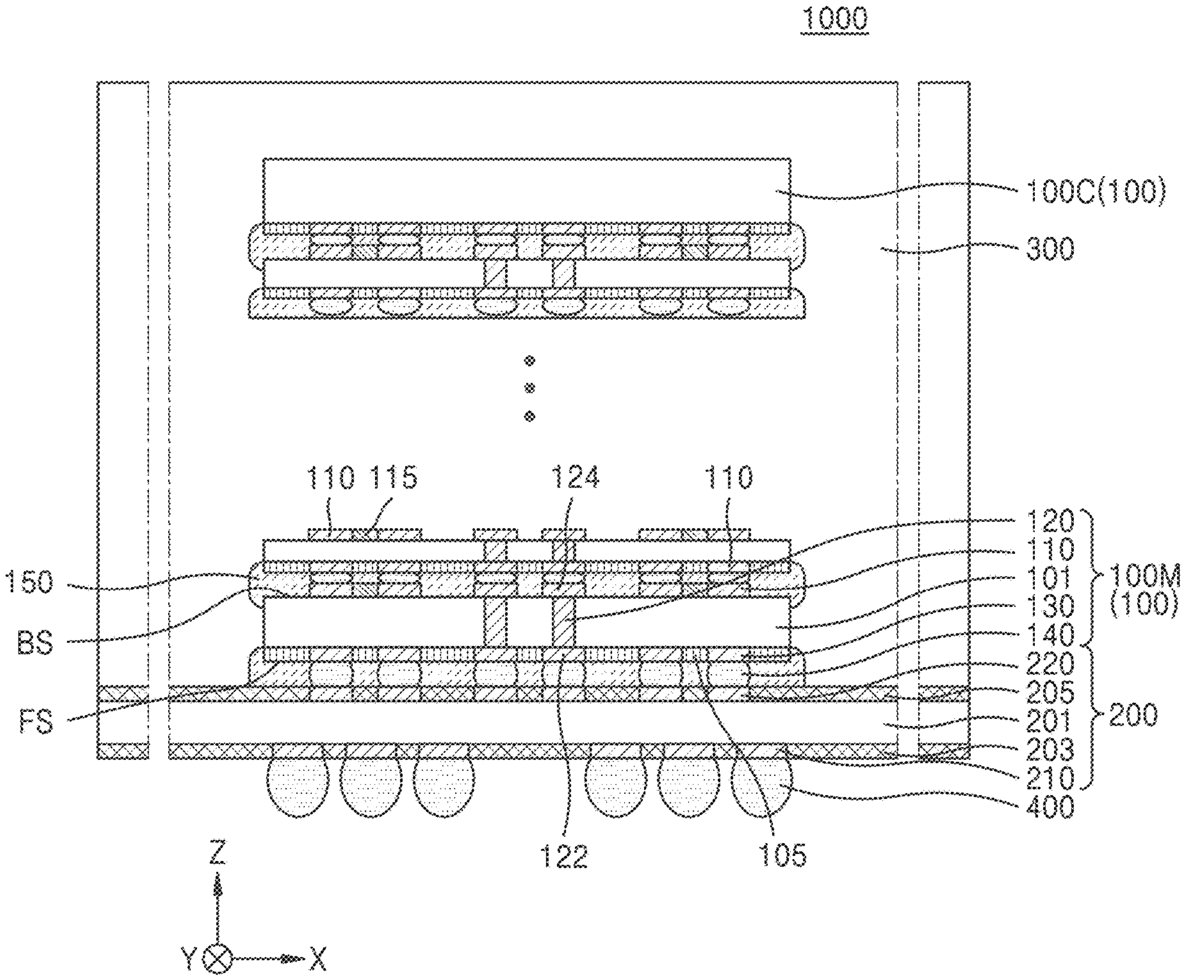

Referring to FIG. 8H, the large package substrate 200S and structures on the large package substrate 200S are separated into the individual package substrates 200 and structures on the individual package substrates 200 through a singulation process. The individual package substrates 200 and structures on the individual package substrates 200 may correspond to the stack semiconductor package 1000 of FIG. 1B. Meanwhile, before the singulation process or after the singulation process, external connection terminals 400 may be attached to the lower surface of the large package substrate 200S or the package substrate 200.

While the inventive concepts have been particularly shown and described with reference to some example embodiments thereof, it will be understood that various changes in form and details may be made therein without departing from the spirit and scope of the following claims.

What is claimed is:

1. A stack semiconductor package comprising:
a base chip;
at least two semiconductor chips stacked on the base chip; and
a sealing material sealing the at least two semiconductor chips on the base chip,
wherein
the at least two semiconductor chips comprise an uppermost semiconductor chip and at least one first semiconductor chip under the uppermost semiconductor chip,
the first semiconductor chip comprises,
through electrodes arranged in a central portion of the first semiconductor chip,
the central portion of the first semiconductor chip being a portion on a plane defined by a first direction and a second direction perpendicular to the first direction, the central portion of the first semiconductor chip disposed centrally along the first direction, the through electrodes arranged along the second direction,
upper dummy pads on outer portions of a back side of the first semiconductor chip, the back side being a non-active surface of the first semiconductor chip, the outer portions being at both sides of the central portion in the first direction, and
a dummy pattern connecting the upper dummy pads with each other on the back side of the first semiconductor chip, and
at least one of the upper dummy pads is connected to one of the through electrodes that is connected to ground through the dummy pattern.

2. The stack semiconductor package of claim 1, wherein at least three of the upper dummy pads are connected to each other through the dummy pattern in at least one of the first direction, the second direction, and a diagonal direction between the first and second directions.

3. The stack semiconductor package of claim 2, wherein the upper dummy pads are provided in two rows each arranged in the second direction,
two of the upper dummy pads adjacent to each other in the first direction are connected to each other through the dummy pattern, and
two of the upper dummy pads adjacent to each other in a first row in the second direction and two of the upper dummy pads adjacent to each other in a second row in the second direction are alternately connected to each other through the dummy pattern, along the second direction.

4. The stack semiconductor package of claim 2, wherein the upper dummy pads include first upper dummy pads arranged at four vertices of a rectangle and a second upper dummy pad arranged at a center of the rectangle, and
the second upper dummy pad is connected to each of the first upper dummy pads through the dummy pattern in the diagonal direction.

5. The stack semiconductor package of claim 4, wherein the rectangle is repeatedly arranged in the second direction, at least a pair of the first upper dummy pads adjacent to each other in the second direction is connected to each other through the dummy pattern, and the second upper dummy pad and another second upper dummy pad adjacent to the second upper dummy pad in the second direction are connected to each other through the dummy pattern.

6. The stack semiconductor package of claim 1, wherein the first semiconductor chip further comprises:

lower dummy pads on a front side, the front side being an active surface, the lower dummy pads corresponding to the upper dummy pads, respectively;

lower electrode pads on the front side and connected to the through electrodes, respectively; and bumps arranged on lower surfaces of the lower dummy pads and the lower electrode pads.

7. The stack semiconductor package of claim 6, wherein upper electrode pads are arranged on upper surfaces of the through electrodes, respectively, and the upper electrode pads and the upper dummy pads include a same structure and a same material.

8. The stack semiconductor package of claim 1, wherein the base chip comprises a package substrate, and the at least two semiconductor chips comprise a master chip and one or more core chips.

9. The stack semiconductor package of claim 1, wherein the base chip comprises a buffer chip, the at least two semiconductor chips comprise core chips, and the base chip includes a through electrode.

10. A stack semiconductor package comprising:

a package substrate;

at least two semiconductor chips stacked on the package substrate;

a sealing material sealing the at least two semiconductor chips on the package substrate; and an external connection terminal on a lower surface of the package substrate, the at least two semiconductor chips including an uppermost semiconductor chip and at least one first semiconductor chip under the upper semiconductor chip, the first semiconductor chip comprising, through electrodes arranged in a central portion of the first semiconductor chip, the central portion of the first semiconductor chip being a portion on a plane defined by a first direction and a second direction perpendicular to the first direction, the central portion of the first semiconductor chip disposed centrally along the first direction, the through electrodes arranged along the second direction, upper dummy pads on outer portions of a back side of the first semiconductor chip, the back side being a non-active surface of the first semiconductor chip, the outer portions being at both sides of the central portion, respectively, in the first direction, and a dummy pattern connecting the upper dummy pads with each other on the back side, wherein at least one of the upper dummy pads is connected to one of the through electrodes that is connected to ground through the dummy pattern.

11. The stack semiconductor package of claim 10, wherein at least three of the upper dummy pads are connected to each other through the dummy pattern in at least one of the first direction, the second direction, and a diagonal direction between the first and second directions.

12. The stack semiconductor package of claim 10, wherein the first semiconductor chip further comprises:

lower dummy pads on a front side, the front side being an active surface, the lower dummy pads corresponding to the upper dummy pads, respectively;

lower electrode pads on the front side and connected to the through electrodes, respectively; and bumps arranged on lower surfaces of the lower dummy pads and the lower electrode pads.

13. The stack semiconductor package of claim 12, wherein upper electrode pads are arranged on upper surfaces of the through electrodes, respectively, and the upper electrode pads and the upper dummy pads include a same structure and a same material.

14. The stack semiconductor package of claim 10, wherein the at least two semiconductor chips comprises a master chip and one or more core chips.

15. A stack semiconductor package comprising:

a buffer chip having first through electrodes;

at least two semiconductor chips stacked on the buffer chip; and a sealing material sealing the at least two semiconductor chips on the buffer chip, wherein the at least two semiconductor chips comprise an uppermost semiconductor chip and at least one first semiconductor chip under the uppermost semiconductor chip, the first semiconductor chip comprising, second through electrodes arranged in a central portion of the first semiconductor chip, the central portion of the first semiconductor chip being a portion on a plane defined by a first direction and a second direction perpendicular to the first direction, the central portion of the first semiconductor chip disposed centrally along the first direction, the second through electrodes arranged along the second direction, upper dummy pads on outer portions of a back side of the first semiconductor chip, the back side being a non-active surface of the first semiconductor chip, the outer portions being at both sides of the central portion, respectively, in the first direction, and a dummy pattern connecting the upper dummy pads with each other on the back side, wherein at least one of the upper dummy pads is connected to one of the second through electrodes that is connected to ground through the dummy pattern.

16. The stack semiconductor package of claim 15, wherein at least three of the upper dummy pads are connected to each other through the dummy pattern in at least one of the first direction, the second direction, and a diagonal direction between the first and second directions.

17. The stack semiconductor package of claim 15, wherein the first semiconductor chip further comprises:

lower dummy pads on a front side, is the front side being an active surface, the lower dummy pads corresponding to the upper dummy pads, respectively;

lower electrode pads on the front side and connected to the second through electrodes, respectively; and bumps arranged on lower surface of the lower dummy pads and the lower electrode pads, and the lower electrode pads include a same structure and a same material as the lower dummy pads.

* * * * *